(12) United States Patent  (10) Patent No.: US 7,754,548 B2
Chae et al.  (45) Date of Patent: Jul. 13, 2010

(54) THIN FILM TRANSISTOR, METHOD OF FABRICATING THE SAME, AND METHOD OF FABRICATING LIQUID CRYSTAL DISPLAY DEVICE HAVING THE SAME

(75) Inventors: Gee Sung Chae, Incheon (KR); Seung Hwan Cha, Incheon (KR)

(73) Assignee: LG Display Co., Ltd., Seoul (KR)

( * ) Notice: Subject to any disclaimer, the term of this patent is extended or adjusted under 35 U.S.C. 154(b) by 330 days.

(21) Appl. No.: 11/802,541

(22) Filed: May 23, 2007

(65) Prior Publication Data

US 2007/0295965 A1  Dec. 27, 2007

(30) Foreign Application Priority Data

Jun. 27, 2006  (KR) ............. 10-2006-0057742
Jun. 28, 2006  (KR) ............. 10-2006-0058356

(51) Int. Cl.
*H01L 21/00*  (2006.01)
(52) U.S. Cl. .............. 438/161; 438/149; 438/158; 438/558; 257/E29.294
(58) Field of Classification Search .......... 438/149, 438/158, 161, 542, 558; 257/E29.294
See application file for complete search history.

(56) References Cited

U.S. PATENT DOCUMENTS

| 5,827,760 | A | | 10/1998 | Seo |
| 6,083,779 | A | * | 7/2000 | Seo ........................ 438/158 |
| 6,514,801 | B1 | * | 2/2003 | Yudasaka et al. ........... 438/151 |
| 6,580,127 | B1 | * | 6/2003 | Andry et al. .............. 257/347 |
| 7,361,529 | B2 | * | 4/2008 | Chabinyc et al. ........... 438/82 |

* cited by examiner

*Primary Examiner*—Ha Tran T Nguyen
*Assistant Examiner*—Daniel Whalen
(74) *Attorney, Agent, or Firm*—Morgan Lewis & Bockius LLP

(57) ABSTRACT

A thin film transistor includes a gate electrode, a gate insulation layer on the gate electrode, source and drain electrodes formed on the gate insulation layer, a polysilicon channel layer overlapping the ohmic contact layers and on the gate insulation layer between the source and drain electrodes, ohmic contact regions over the source and drain electrodes for contacting the polysilicon channel to the source and drain electrodes, and doping layers over the source and drain electrodes.

6 Claims, 15 Drawing Sheets

US 7,754,548 B2

THIN FILM TRANSISTOR, METHOD OF FABRICATING THE SAME, AND METHOD OF FABRICATING LIQUID CRYSTAL DISPLAY DEVICE HAVING THE SAME

This invention claims the benefit of Korean Patent Application No. 10-2006-057742 filed in Korea on Jun. 27, 2006, and Korean Patent Application No. 10-2006-058356 filed in Korea on Jun. 28, 2006, which are hereby incorporated by reference in their entirety.

BACKGROUND OF THE INVENTION

1. Field of the Invention

Embodiments of the present invention relate to a transistor, and more particularly, to a thin film transistor (TFT), a method for fabricating the same, and a method of fabricating a liquid crystal display device having the same. Although embodiments of the invention are suitable for a wide scope of applications, it is particularly suitable for forming a channel layer of the TFT through an inkjet process.

2. Description of the Related Art

Generally, an active matrix liquid crystal display (active matrix LCD) that is widely used in a variety of image displays uses a thin film transistor (TFT) as a switching element. A semiconductor layer of the thin film transistor is formed of amorphous silicon. The use of the amorphous silicon is advantageous in fabricating a small-sized TFT LCD. However, since the amorphous silicon has low mobility, it is difficult to use amorphous silicon in fabricating TFTs of a large-sized TFT LCD.

Research for using a polysilicon layer having superior mobility as the semiconductor layer in a TFT has been active. Since polysilicon can be easily used in fabricating TFTs of the large-sized TFT LCD and a drive integrated circuit (IC) can be formed on the substrate on which the TFTs are arrayed, integration can be improved and the fabrication costs can be reduced. Methods of forming the polysilicon layer include directly depositing the polysilicon and crystallizing the polysilicon after amorphous silicon is deposited. Typically, the latter is widely used. That is, after the amorphous silicon layer is formed on a substrate and a crystallizing process is performed to change the amorphous silicon layer into a polysilicon layer.

A polysilicon TFT includes a gate electrode and a source/drain electrode, which are insulated from each other by insulation layers to independently operate. The insulation layer is usually formed of an inorganic insulation material, such as silicon nitride (SiNx) or silicon oxide (SiOx) that has excellent manipulation property and excellent adhesion to metal.

FIG. 1 is a cross-sectional view of a TFT fabricated in accordance with the related art fabrication method. As shown in FIG. 1, a TFT is formed by forming a buffer layer 2 functioning as an insulation layer on a substrate 10 and subsequently forming an amorphous silicon (a-Si) layer on the buffer layer 2. A plasma-enhanced CVD process using $SiH_4$ gas, a low-pressure CVD process, or a sputtering process at a temperature of about 300-400° C. is used to deposit an organic insulation material, such as SiNx or SiOx. After the amorphous silicon layer is formed on the buffer layer 2, an annealing process using an excimer laser is performed to crystallize the amorphous silicon layer into a polysilicon layer, after which the polysilicon layer is patterned into a channel layer 4. Subsequently, the organic insulation material, such as SiNx or SiOx, is deposited over the substrate 10 to cover the channel layer 3, thereby forming a gate insulation layer 5.

Next, a conductive material, such as aluminum (Al) or an Al alloy, is deposited over the gate insulation layer 5 and is patterned through a photolithography process, thereby forming a gate electrode 1 on the channel layer 4. Subsequently, N-type impurities are doped using the gate electrode 1 as a mask, thereby forming an ohmic contact layer 6 on the channel layer 4. At this point, an ion doped region is a region where source/drain electrodes 9a and 9b are formed and a portion of the channel layer 4 under the gate electrode 1 where the impurities are not doped by becomes a channel region.

Next, an organic insulation material, such as SiNx or SiOx is deposited over the substrate 10 on which the gate electrode 1 is formed, thereby forming an inter-insulation layer 7. The deposition of the organic material for the inter-insulation layer 7 is performed by a method identical to that for forming the gate insulation layer 5. Subsequently, contact holes are formed by etching portions of the inter-insulation layer 7 and the gate insulation layer 5.

A metal layer is formed on the substrate 10 on which the contact holes are formed and is etched to form the source/drain electrodes 9a and 9b, thereby completing the polysilicon TFT. However, according to the above-described related art TFT fabrication method, since the masking process is necessary, the fabrication process is complicated. Especially, since the channel layer and the ohmic contact layer formed through the ion doping process are formed through independent processes, the fabrication process is further complicated and the fabrication costs are increase.

SUMMARY OF THE INVENTION

Accordingly, embodiments of the present invention are directed to a TFT, a method of fabricating the TFT, and a method of fabricating an LCD device having the TFT that substantially obviate one or more problems due to limitations and disadvantages of the related art.

An object of embodiments of the invention is to provide a TFT having a polysilicon channel with a reduced number of processing steps.

Another object of embodiments of the invention is to provide a TFT having a polysilicon channel at a low processing temperature.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a thin film transistor includes a gate electrode, a gate insulation layer on the gate electrode, source and drain electrodes formed on the gate insulation layer, a polysilicon channel layer overlapping the ohmic contact layers and on the gate insulation layer between the source and drain electrodes, ohmic contact regions over the source and drain electrodes for contacting the polysilicon channel to the source and drain electrodes, and doping layers over the source and drain electrodes.

In another aspect, a method of forming a thin film transistor includes forming a gate electrode on a substrate, forming a gate insulation layer on the gate electrode, forming source and drain electrodes on the gate insulation layer, forming doping layers over the source and drain electrodes, and forming a polysilicon channel layer on the gate insulation layer between the source and drain electrodes and ohmic contact regions contacting the polysilicon channel to the source and drain electrodes.

In yet another aspect, a method of forming a thin film transistor includes forming a gate electrode on a substrate, forming a gate insulation layer on the gate electrode, forming source and drain electrodes on the gate insulation layer, forming doping layers over the source and drain electrodes, providing a liquid-phase silicon layer in between the source and drain electrodes and on the doping layers through a coating process, and annealing the liquid-phase silicon layer to form a polysilicon channel layer and ohmic contact regions for contacting the polysilicon channel to the source and drain electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
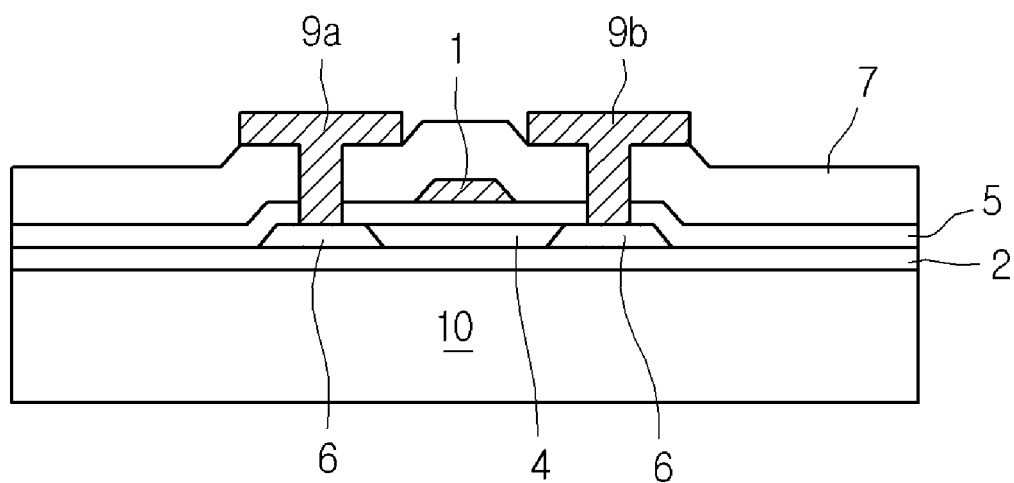
FIG. 1 is a cross-sectional view of a TFT fabricated in accordance with the related art fabrication method.
Figure 2A:
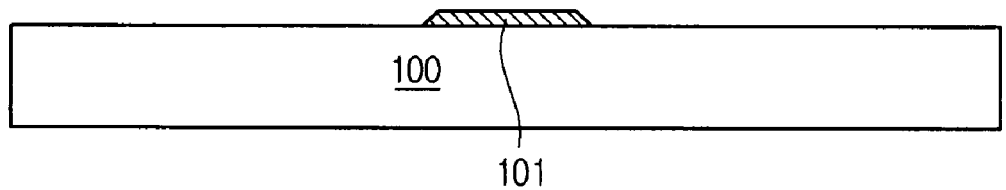
FIGS. 2A through 2E are cross-sectional views illustrating a method of fabricating a TFT according to a first embodiment of the present invention.
Figure 2B:
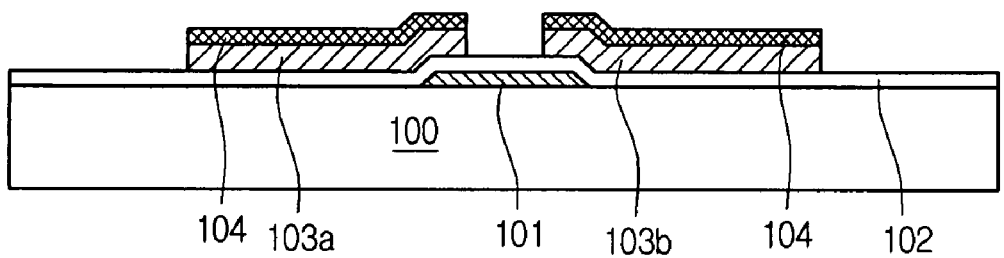

FIGS. 2A through 2E are cross-sectional views illustrating a method of fabricating a TFT according to a first embodiment of the present invention. As shown in FIGS. 2A and 2B, a metal layer is formed on a transparent insulation substrate 100 and etched to form a gate electrode 101, after which a gate insulation layer 102 is formed on the insulation substrate 100 covering the gate electrode 101. The gate insulation layer 102 is an inorganic insulation layer, such as SiNx or SiOx.

Next, a metal layer is formed on the gate insulation layer 102 formed on the insulation layer and a doping layer is formed on the metal layer. The doping layer may be a phosphor-silicate-glass (PSG) layer, boro-silicate-glass (BSG) layer or an amorphous silicon layer doped with N+ ions or P+ ions. After the metal layer and the doping layer are formed on the gate insulation layer 102, as shown in FIG. 2B, photoresist is deposited on the doping layer. Then, source electrode 103a, drain electrode 103b and doping layers 104 are simultaneously formed by etching the metal and doping layers in accordance with a mask process. Accordingly, the doping layers 104 are each formed entirely over the source and drain electrodes 103a and 103b.

Figure 2C:
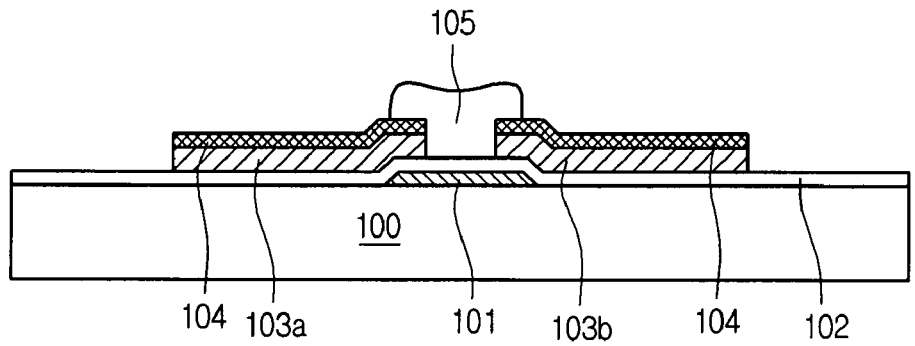

As shown in FIG. 2C, after the source and drain electrodes 103a and 103b are formed on the gate insulation layer 102, a liquid-phase silicon layer 105 is formed over and in between the source and drain electrodes 103a and 103b through a coating process, such as an inkjet method. The liquid-phase silicon layer 105 is formed from a silicon containing liquid-phase material, such as $SixH_2x$ (CyclopentaSilane).

Figure 2D:
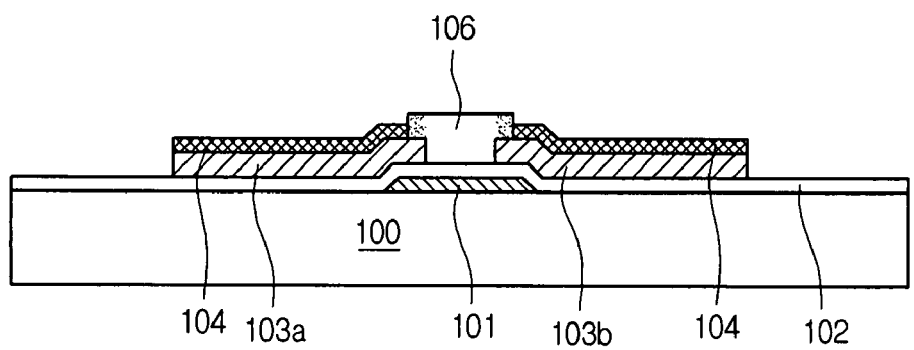

After the liquid-phase silicon layer 105 is formed in the channel region defined between the source and drain electrodes 103a and 103b, an annealing process is performed to form a polysilicon channel layer 106 on the gate insulation layer 102 between the source and drain electrodes 103a and 103b and overlapping the doping layers 104, as shown in FIG. 2D. As the annealing process is performed, a thickness of the liquid-phase silicon layer 105 is reduced such that a height of the channel layer 106 above the gate insulation layer 102 becomes a little more than that defined by the source and drain electrodes 103a and 103b. The annealing process is performed by heating the substrate up to a temperature of 200-800° C. (540° C.) and irradiating a laser having a wavelength of 308 nm and an energy of 345 mJ/cm2. In more detail, solvent contained in the channel pattern is removed through the heating process and thus a thickness of the channel pattern is reduced. Further, the silicon is changed into polysilicon by irradiating the laser while dopants from the doping layers 104 diffuse into the source and drain electrodes 103a and 103b. However, embodiments of the present invention are not limited to this configuration. The heating temperature and the energy of the laser may vary in accordance with a degree of crystallization, or a size of the LCD device and a material property of the liquid-phase silicon.

Figure 2E:
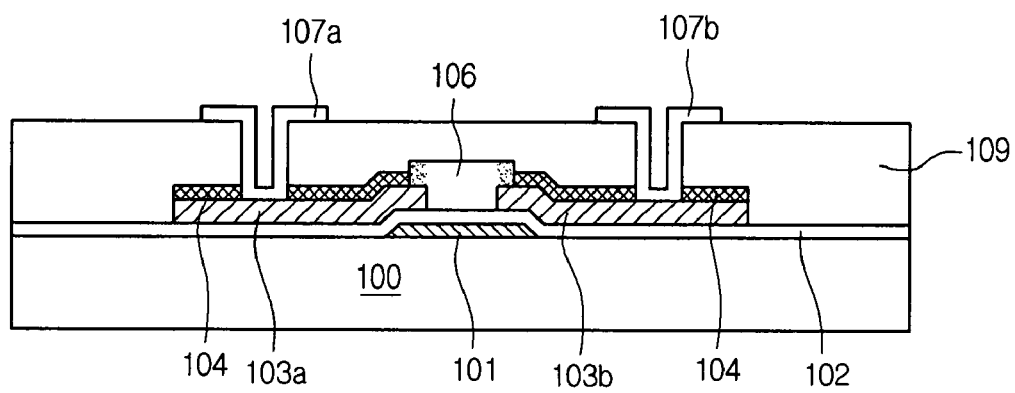

After the channel layer 106 is formed, a passivation layer 109 is formed on the insulation substrate 100 and etched to expose the source and drain electrodes 103a and 103b, as shown in FIG. 2E, . The passivation layer 109 may be a SiNx-base inorganic layer or an acryl-based organic layer. Subsequently, a metal layer is formed on the passivation layer 109 and patterned to form terminals 107a and 107b that electrically contact the source and drain electrodes 103a and 103b, respectively.

The method of fabricating the TFT according to the first embodiment has an advantage of forming the polysilicon channel layer without performing deposition and mask processes. Further, since the channel layer is formed without performing a PECVD process, the process load can be reduced.

Figure 3A:
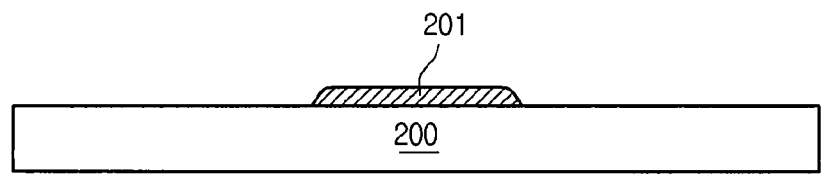
FIGS. 3A through 3E are cross-sectional views illustrating a method of fabricating a TFT according to a second embodiment of the present invention.
Figure 3B:
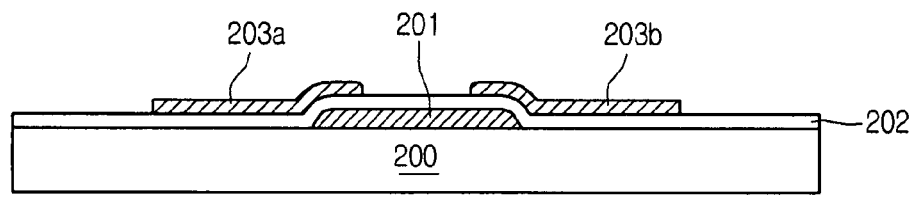

FIGS. 3A through 3E are cross-sectional views illustrating a method of fabricating a TFT according to a second embodiment of the present invention. As shown in FIGS. 3A and 3B, a metal layer is formed on a transparent insulation substrate 200 and etched to form a gate electrode 201, after which a gate insulation layer 202 is formed on the insulation substrate 200 covering the gate electrode 201. The gate insulation layer 202 is an inorganic insulation layer, such as SiNx or SiOx.

Figure 3C:
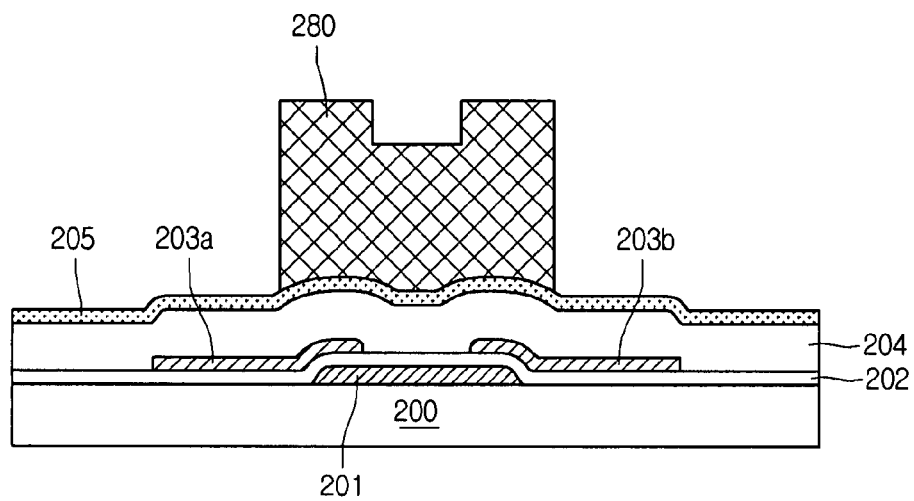

Next, a metal layer is formed over the gate insulation layer 202. Then, source and drain electrodes 203a and 203b are formed through a photolithography process. After the source and drain electrodes 203a and 203b are formed on the gate insulation layer 202, a liquid-phase silicon layer 204 is formed over and in between the source and drain electrodes 203 and 203b. Then, a doping layer 205 is formed on the liquid-phase silicon layer 204, as shown in FIG. 3C. The liquid-phase silicon layer 204 is formed of a silicon containing liquid phase material, such as $Si_xH_{2x}$ (CyclopentaSilane) and the doping layer 205 may be a PSG (Phosphor-Silicate-Glass) layer, a boro-silicate-glass layer, or an amorphous silicon layer doped with $N^+$ or $P^+$ ions. After the liquid-phase silicon layer 204 and the doping layer 205 are formed, photoresist is deposited on the doping layer 205, after which a halftone pattern 280 is formed at a channel region, defined between the source and drain electrodes 203a and 203b over the gate electrode 202, through a diffraction mask or halftone mask process.

Figure 3D:
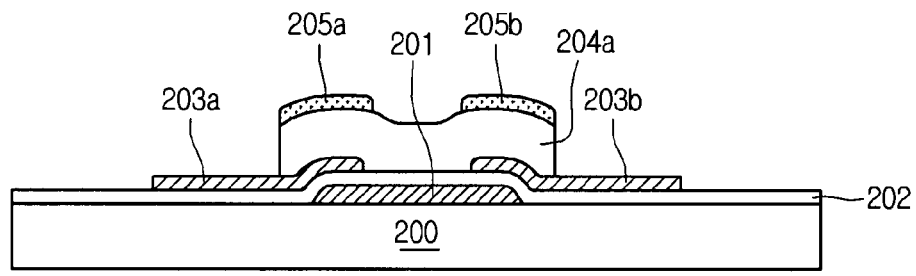

After the halftone pattern 280 is formed on the doping layer 205, an etching process is performed to form a channel pattern 204a and doping layers 205a and 205b that are respectively overlapping the source and drain electrodes 203a and 203b on the channel pattern 204a, as shown in FIG. 3D.

Figure 3E:
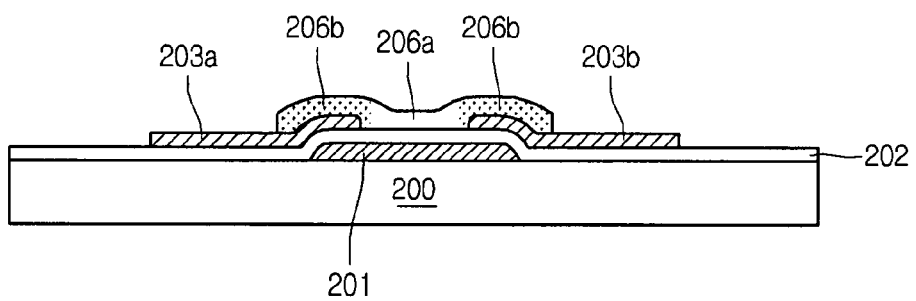

Subsequently, as shown in FIG. 3E, an annealing process and a contact layer forming process are performed using a laser to form a polysilicon channel layer 206a on the gate insulation layer 102 between the source and drain electrodes 203a and 203b and to form ohmic contact layers 206b at the edges of the polysilicon channel layer 206a contacting the source and drain electrodes 203a and 203b. That is, according to the TFT fabrication method of the second embodiment, the polysilicon channel layer 206a and the ohmic contact layer 206b are simultaneously formed through a single process. The annealing process and the contact layer forming process are performed by heating the substrate up to a temperature of 200-800° C. (about 540° C.) and irradiating a laser having a wavelength of 308 nm and an energy of 345 mJ/cm2. In more detail, solvent contained in the channel pattern is removed through the heating process and thus a thickness of the channel pattern is reduced. Further, the silicon is changed into polysilicon by irradiating the laser. In addition, during the above process, the doping layer is vertically diffused into the channel pattern to form the ohmic contact layers 206b.

After the channel layer 206a and the ohmic contact layers 206b are formed on the insulation substrate 200, although not shown in the drawings, a passivation layer (insulation layer) is additionally formed on the insulation substrate 200, after which a contact hole forming process for exposing the source and drain electrodes 203a and 203b is performed. Subsequently, a metal layer is formed on the insulation substrate 100 and patterned to form power terminals that electrically contact the source and drain electrodes 203a and 203b, respectively.

The method of fabricating the TFT according to the second embodiment has an advantage of simultaneously forming the channel layer and the ohmic contact layer after the channel layer region and the ohmic contact layer are patterned using the halftone pattern (see FIG. 2E). Further, since the channel layer is formed without performing a PECVD process, the process load can be reduced.

Figure 4A:
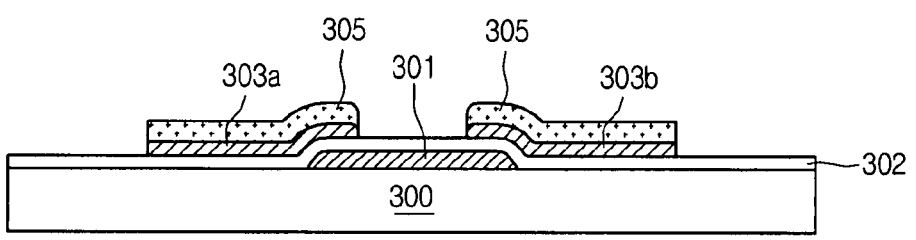
FIGS. 4A through 4C are cross-sectional views illustrating a method of fabricating a TFT according to a third embodiment of the present invention.
Figure 4B:
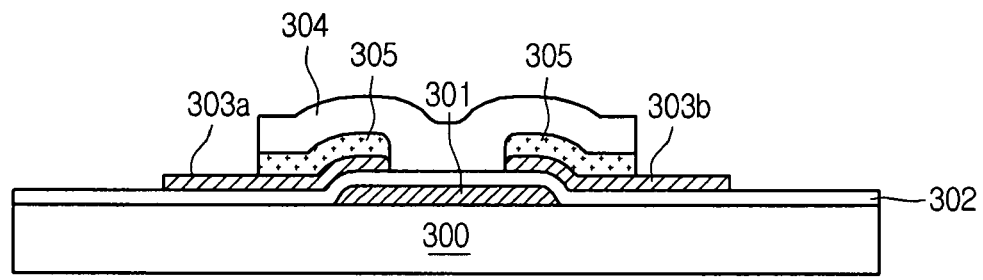
Figure 4C:
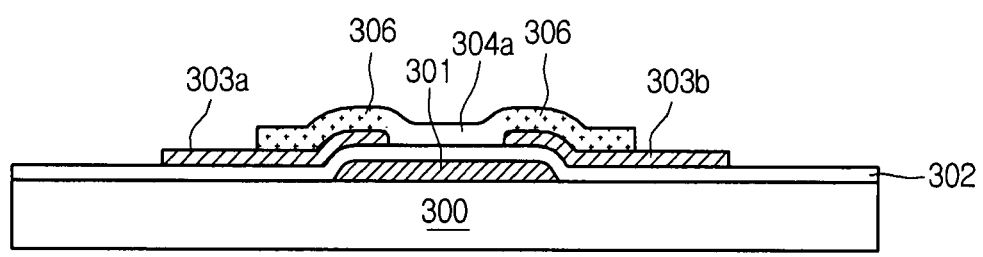

FIGS. 4A through 4C are cross-sectional views illustrating a method of fabricating a TFT according to a third embodiment of the present invention. As shown in FIG. 4A, a metal layer is formed on a transparent insulation substrate 300 and etched to form a gate electrode 301, after which a gate insulation layer 302 is formed on the insulation substrate 300 covering the gate electrode 301. The gate insulation layer 302 is an inorganic insulation layer, such as SiNx or SiOx. Next, a metal layer is formed over the gate insulation layer 302 and a doping layer is formed on the metal layer. The doping layer may be a PSG layer, a BSG, or an amorphous silicon layer doped with $N^+$ or $P^+$ ions. After the metal layer and the doping layer are formed on the insulation substrate 300, photoresist is deposited on the doping layer and source and drain electrodes 303a and 303b and doping layers 304 are simultaneously formed by etching the metal and doping layers in accordance with a mask process. Accordingly, doping patterns 305 are respectively formed over the source and drain electrodes 303a and 303b.

After the source and drain electrodes 303a and 303b are formed on the gate insulation layer 302, a liquid-phase silicon layer is formed over and in between the source and drain electrodes 303a and 303b through an inkjet method. The liquid-phase silicon layer is formed of a silicon containing liquid-phase material, such as $Si_xH_{2x}$ (CyclopentaSilane). After the liquid-phase silicon layer is formed between the source and drain electrodes 303a and 303b, a channel pattern 304, as shown in FIG. 4B, is formed between the source and drain electrodes 303a and 303b by etching the liquid-phase silicon layer through a photolithograph process, including a mask process. At this point, a portion of the doping pattern 305, which is not formed under edges of the channel pattern, is removed.

After the channel pattern 304 is formed between the source and drain electrodes 303a and 303b, an annealing process is performed to form a polysilicon channel layer 304a between the source and drain electrodes 303a and 303b and an ohmic contact layers 306 at both edges of the channel layer 304a for connecting to the source and drain electrodes 303a and 303b, as shown in FIG. 4C. As the annealing process is performed, a thickness of the liquid-phase silicon layer is reduced and dopants doped in the ohmic contact layer 306 are diffused into both edges of the channel layer 304a. The annealing process is performed by heating the substrate up to a temperature of 200-800° C. (540° C.) and irradiating a laser having a wavelength of 308 nm and an energy of 345 mJ/cm². In more detail, solvent contained in the channel pattern is removed through the heating process and thus a thickness of the channel pattern is reduced. Further, the silicon is changed into polysilicon by irradiating the laser. However, embodiments of the present invention are not limited to this configuration. The heating temperature and the energy of the laser may vary in accordance with a degree of crystallization, or a size of the LCD device and a material property of the liquid-phase silicon. After the channel layer 304a is formed, a passivation layer and terminals can be further formed.

The method of fabricating the TFT according to the third embodiment has an advantage of forming the channel layer without performing deposition and mask processes. Further, since the channel layer is formed without performing a PECVD process, the process load can be reduced.

Figure 5A:
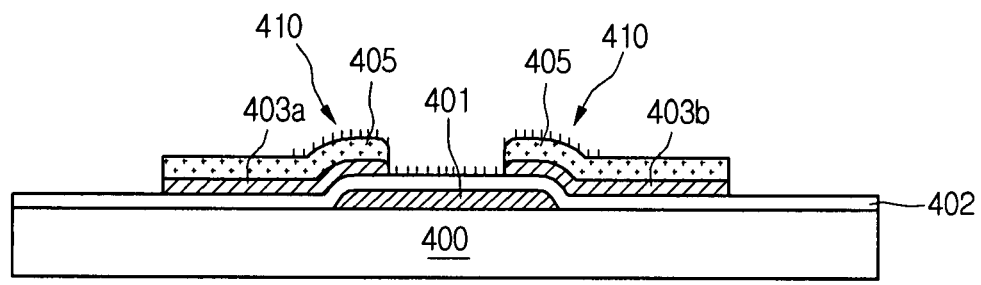
FIGS. 5A through 5C are cross-sectional views illustrating a method of fabricating a TFT according to a fourth embodiment of the present invention.
Figure 5B:
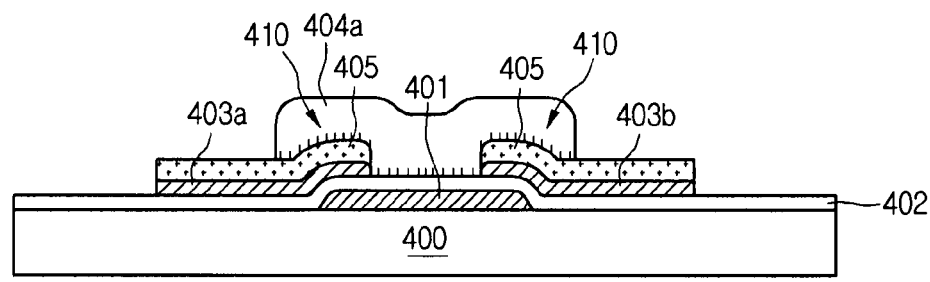
Figure 5C:
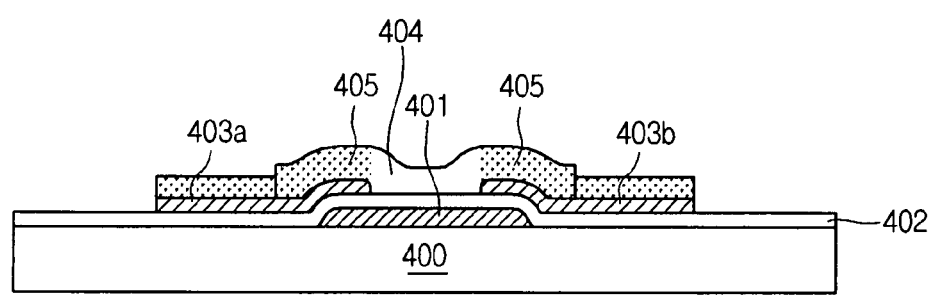

FIGS. 5A through 5C are cross-sectional views illustrating a method of fabricating a TFT according to a fourth embodiment of the present invention. As shown in FIG. 5A, a metal layer is formed on a transparent insulation substrate 400 and etched to form a gate electrode 401, after which a gate insulation layer 402 is formed on the insulation substrate 400 covering the gate electrode 401. The gate insulation layer 402 is an inorganic insulation layer, such as SiNx or SiOx. Next, a metal layer is formed over the gate insulation layer 402 and a doping layer is formed on the metal layer. The doping layer may be a PSG layer, a BSG layer, or an amorphous silicon layer doped with $N^+$ or $P^+$ ions. After the metal layer and the doping layer are formed on the gate insulation layer 402, photoresist is deposited on the doping layer and source and drain electrodes 403a and 403b and an ohmic contact layers 405 are simultaneously formed by etching the metal and doping layers in accordance with a mask process.

After the source and drain electrodes 403a and 403b are formed, a self-assembled monolayer (SAM) 410 is applied to the an ohmic contact layers 405 and the gate insulation layer 402 between the source and drain electrodes 403a and 403b. The SAM 410 has a hydrophilic or hydrophobic property. The property of the SAM 410 varies in accordance with whether a liquid-phase silicon layer, which will be formed in the following process has a hydrophilic or hydrophobic property.

After the SAM 410 is applied in the channel region between the source and drain electrodes 403a and 403b, a liquid-phase silicon layer is formed in the channel region and on the ohmic contact layers 405 through a coating process, such as an inkjet method, as shown in FIG. 5B. The liquid-phase silicon layer is formed of silicon containing liquid-phase material, such as $Si_xH_{2x}$ (CyclopentaSilane).

After the liquid-phase silicon layer is formed over and in between the source and drain electrodes 403a and 403b and overlapping the ohmic contact layers 405, the liquid-phase silicon layer exists only on a region of the SAM 410 to form a channel pattern 404a. When the SAM 410 has a hydrophilic property and a liquid-phase silicon layer having a hydrophilic property is formed through a coating or inkjet method, the liquid-phase silicon layer exists only on the channel region to form the channel pattern 404a. After the channel pattern 404a is formed, an annealing process is performed to form a channel layer 404, as shown in FIG. 5C. Although not shown in the drawings, as the annealing process is performed, a thickness of the liquid-phase silicon layer is reduced and dopants doped in the ohmic contact layer 405 are diffused to the both edges of the channel layer 404.

The annealing process is performed by heating the substrate up to a temperature of 200-800° C. (540° C.) and irradiating a laser having a wavelength of 308 nm and an energy of 345 mJ/cm2. In more detail, solvent contained in the channel pattern is removed through the heating process and thus a thickness of the channel pattern is reduced. Further, the silicon is changed into polysilicon by irradiating the laser. However, embodiments of the present invention are not limited to this configuration. The heating temperature and the energy of the laser may vary in accordance with a degree of crystallization, or a size of the LCD device and a material property of the liquid-phase silicon. After the channel layer 404 is formed, a passivation layer and terminals can be further formed.

The method of fabricating the TFT according to the fourth embodiment has an advantage of forming the channel layer without performing deposition and masking processes. Further, since the channel layer is formed without performing a PECVD process, the process load can be reduced.

Figure 6A:
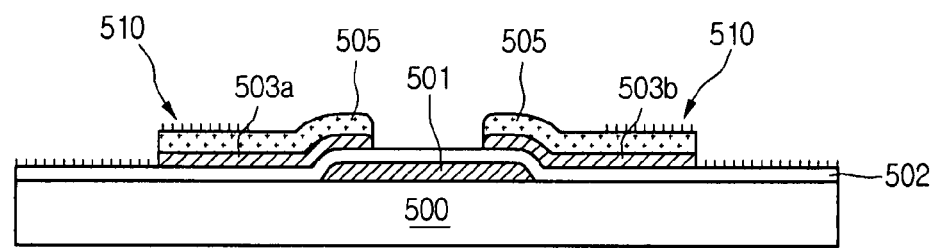
FIGS. 6A through 6C are cross-sectional views illustrating a method of fabricating a TFT according to a fifth embodiment of the present invention.
Figure 6B:
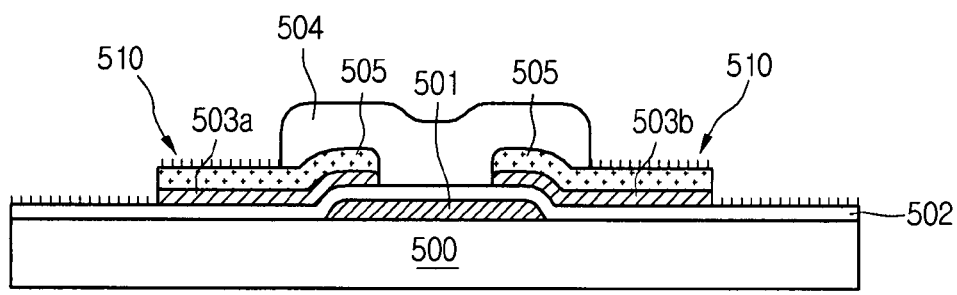
Figure 6C:
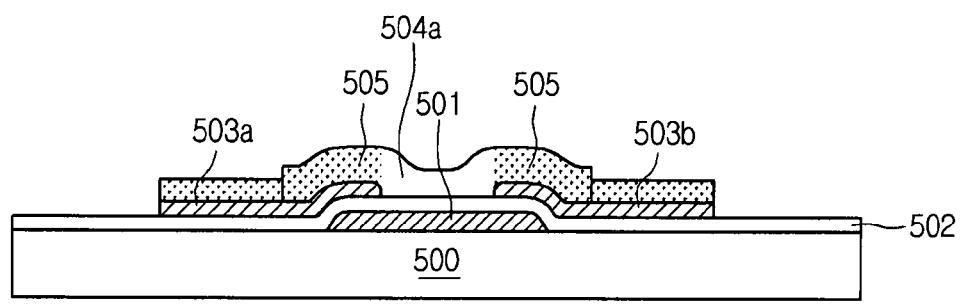

FIGS. 6A through 6C are cross-sectional views illustrating a method of fabricating a TFT according to a fifth embodiment of the present invention. As shown in FIG. 6A, a metal layer is formed on a transparent insulation substrate 500 and etched to form a gate electrode 501, after which a gate insulation layer 502 is formed on the insulation substrate 500 covering the gate electrode 501. The gate insulation layer 502 is an inorganic insulation layer, such as SiNx or SiOx.

Next, a metal layer is formed over the gate insulation layer 502 and a doping layer is formed on the metal layer. The doping layer may be a PSG layer, a BSG layer, or an amorphous silicon layer doped with N+ or P+ ions. After the metal layer and the doping layer are formed on the gate insulation layer 502, photoresist is deposited on the doping layer and source and drain electrodes 503a and 503b and doping layers 505 are simultaneously formed by etching the metal and doping layers in accordance with a mask process.

After the source and drain electrodes 503a and 503b are formed, a self-assembled monolayer (SAM) 510 is applied to edge portions of the doping layers 505 away from the channel region between the source and drain electrodes 503a and 503b and on the gate insulation layer 502 outside of the channel area. The SAM 510 has a hydrophilic or hydrophobic property. The property of the SAM 510 varies in accordance with whether a liquid-phase silicon layer, which will be formed in the following process has a hydrophilic or hydrophobic property.

After the SAM 510 is applied outside of the channel region between the source and drain electrodes 503a and 503b, a liquid-phase silicon layer is formed in the channel region and on the ohmic contact layers 505 through an inkjet method. The liquid-phase silicon layer is formed of a silicon containing liquid-phase material, such as SixH2x (CyclopentaSilane).

After the liquid-phase silicon layer is formed in the channel region between the source and drain electrodes 503a and 503b and overlapping the ohmic contact layers 505, the liquid-phase silicon layer exists only on a region where the SAM 510 is not present to form a channel pattern 504. For example, when the SAM 510 has a hydrophobic property, a liquid-phase silicon layer having a hydrophilic property is formed through a coating or inkjet method and thus the liquid-phase silicon layer exists only on the region where the SAM 510 is not present to form the channel pattern 504.

When the channel pattern 504 is formed in the channel region between the source and drain electrodes 503a and 503b and overlapping the ohmic contact layers 505, an annealing process is performed to form a polysilicon channel layer 504a, as shown in FIG. 6C. Although not shown in the drawings, as the annealing process is performed, a thickness of the liquid-phase silicon layer is reduced and dopants doped in the ohmic contact layer 505 are diffused at both edges of the channel layer 504a.

The annealing process is performed by heating the substrate up to a temperature of 200-800° C. (540° C.) and irradiating a laser having a wavelength of 308 nm and an energy of 345 mJ/cm$^2$. In more detail, solvent contained in the channel pattern is removed through the heating process and thus a thickness of the channel pattern is reduced. Further, the silicon is changed into polysilicon by irradiating the laser. However, the present invention is not limited to this configuration. The heating temperature and the energy of the laser may vary in accordance with a degree of crystallization, or a size of the LCD device and a material property of the liquid-phase silicon. After the channel layer 504a is formed, a passivation layer and a power terminal can be further formed.

The method of fabricating the TFT according to the fifth embodiment has an advantage of forming the channel layer without performing deposition and mask processes. Further, since the channel layer is formed without performing a PECVD process, the process load can be reduced.

Figure 7:
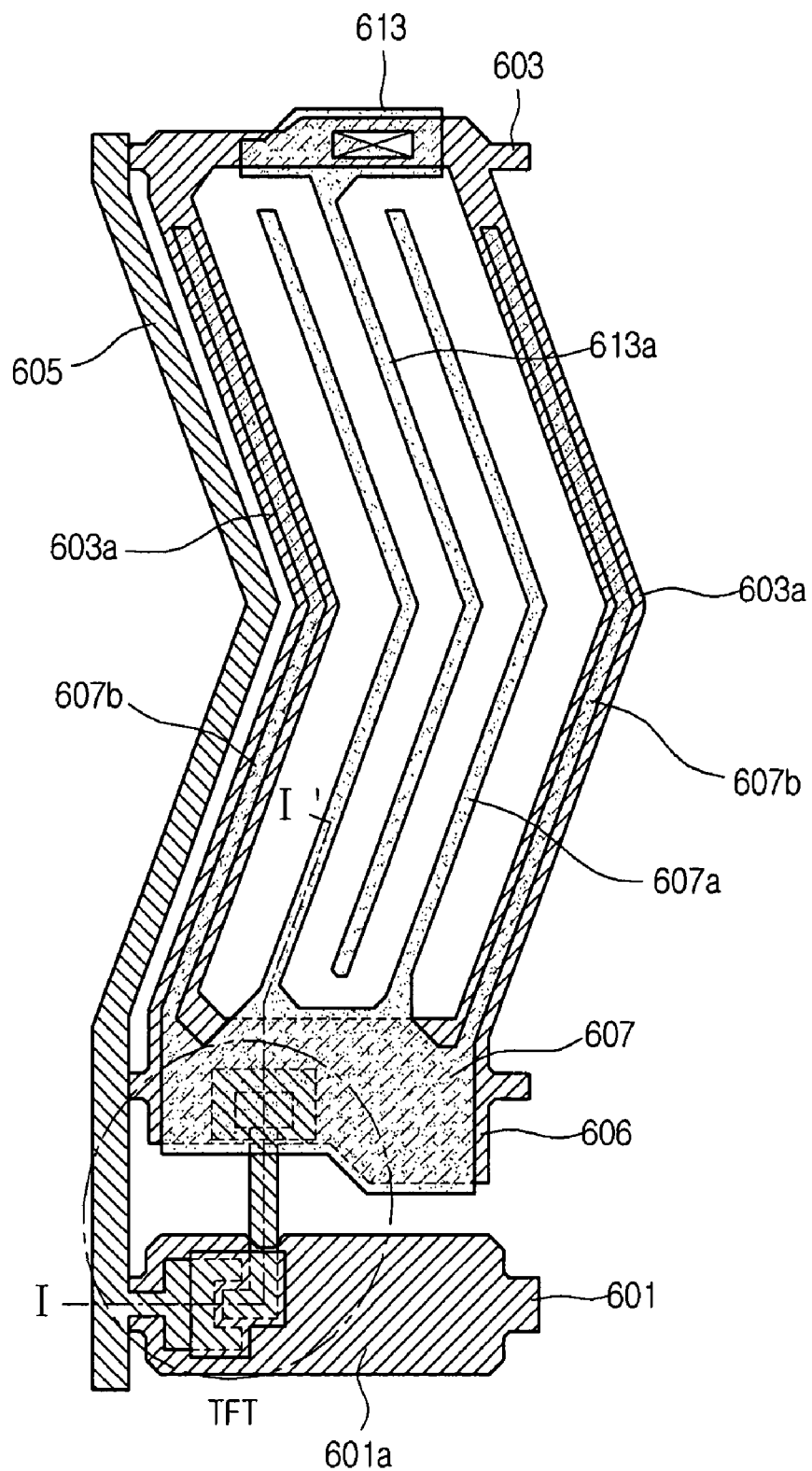
FIG. 7 is a top plan view of a pixel structure of a liquid crystal display device according to the first embodiment of the present invention.

FIG. 7 is a top plan view of a pixel structure of a liquid crystal display device according to a first embodiment of the present invention. As shown in FIG. 7, a gate line 601 for applying a driving signal and a data line 605 for applying a data signal are arranged to cross each other to define a unit pixel area and a TFT is disposed at a region where the gate line 601 crosses the data line 605. Since the TFT is formed by forming a liquid-phase silicon in a channel region through an inkjet method, the channel layer is formed between the source and drain electrodes and overlapping the ohmic contact layers of the source and drain electrodes.

A first common line 603 is formed at the unit pixel area. The first common line 603 is in parallel with the gate line 601 and crosses the data lien 605. A first common electrode 603a extends from opposite sides of the common line 603 in parallel to the data line 605. A first common line 603 is formed at the unit pixel area, and a first common electrode 603a extends from opposite sides of the common line 603 in parallel to the data line 605. Here, the data line 605 and the first common electrode 603a are bent at a predetermined angle to provide a wide viewing angle. Further, a first storage electrode 606 is formed at a region adjacent to the gate line 601 and the gate electrode 601a and connected to the first common electrode 603a. Accordingly, the first storage electrode 606 is integrally formed with the first common line 603, the first common electrode 603a and the first storage electrode 606 to define a closed loop structure.

A second common line 613 is formed to overlap a central region of the first common line 603 formed at the unit pixel area and electrically connected to the first common line 603. The second common electrode 613 a also extends from the second common line 613 along the unit pixel area. Further, the second common electrode 613a is also bent at a predetermined angle to be parallel with the first common electrode 603a and the data line 605, thereby providing a wide viewing angle.

A second storage electrode 607 for forming a storage capacitance is formed above the first storage electrode 606 to overlap the first storage electrode 606. First and second pixel electrodes 607a and 607b extend from the second storage electrode 607 to the unit pixel area. More particularly, the first pixel electrodes 607a extend from the second storage electrode 607 and are alternately arranged with the second common electrodes 613 at a transmission area of the unit pixel area. The first pixel electrodes 607a are also bent at the predetermined angle to thereby provide for a wide viewing angle.

The second pixel electrodes 607b arranged at both edges of the pixel area extend from the second storage electrode 607 and are disposed to overlap the first common electrode 603a extending from the first common line 603. That is, the storage capacitance is formed between the first and second storage electrodes 606 and 607 and another storage capacitance is formed between the first common electrode 603a and the second pixel electrode 607b, thereby increasing the overall storage capacitance. As described above, as the overall storage capacitance increases in the unit pixel area, the display quality improves.

The TFT of the first embodiment has an advantage of forming the channel layer without performing deposition and mask processes. Further, since the channel layer is formed without performing a PECVD process, the process load can be reduced.

Figure 8A:
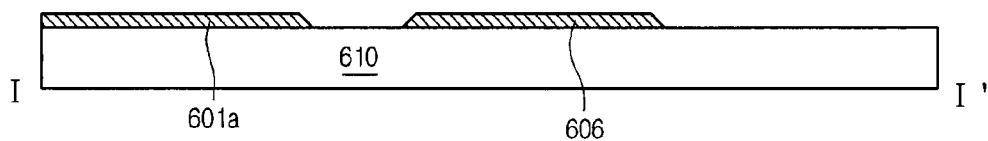
FIGS. 8A through 8F are cross-sectional views taken along line I-I' of FIG. 7, illustrating a method of fabricating the liquid crystal display device of FIG. 7.

FIGS. 8A through 8F are cross-sectional views taken along line I-I' of FIG. 7, illustrating a method of fabricating the liquid crystal display device of FIG. 7. As shown in FIG. 8A, a metal layer is formed on a transparent insulating substrate 610 and the gate line (see FIG. 7), gate electrode 601a, first common line (see FIG. 7), and first storage electrode 606 are formed through a first mask process.

Figure 8B:
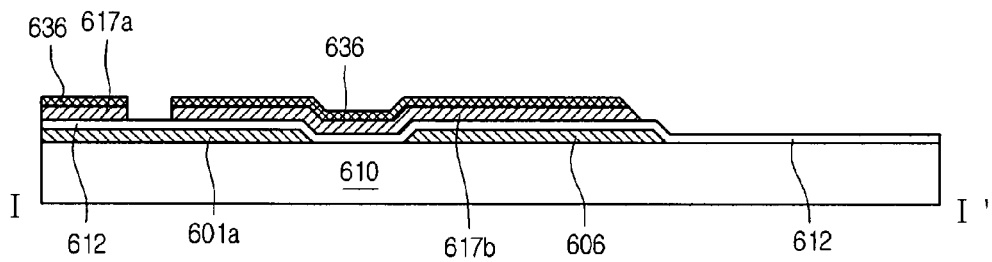

Then, a gate insulation layer 612 is formed over the gate line (see FIG. 7), gate electrode 601a, first common line (see FIG. 7), and first storage electrode 606 on the insulation substrate 610. Subsequently, metal and doping layers are formed on the entire surface of the gate insulation layer 612. The doping layer may be a PSG layer, a BSG layer, or an amorphous silicon layer doped with N+ or P+ ions. After the metal layer and the doping layer are formed, photoresist is deposited on the doping metal layer. Source and drain electrodes 617a and 617b, an ohmic contact layer 636, and the data line (not shown) are simultaneously formed by etching the metal and doping layers in accordance with a mask process, as shown in FIG. 8B. Accordingly, the ohmic contact layers 636 are formed on the source and drain electrodes 617a and 617b. At this time, the data line is formed to cross the gate line, thereby defining the pixel area.

Figure 8C:
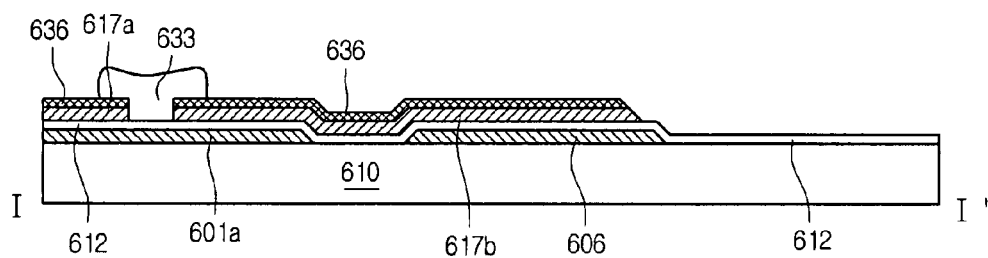

After the source and drain electrodes 617a and 617b are formed, a liquid-phase silicon layer 633 is formed in a channel region defined between the source and drain electrodes 617a and 617b and on the ohmic contact layers 636 through an inkjet method, as shown in FIG. 8C. The liquid-phase silicon layer 633 is formed of silicon containing material, such as $SiX H_2 x$ (CyclopentaSilane).

Figure 8D:
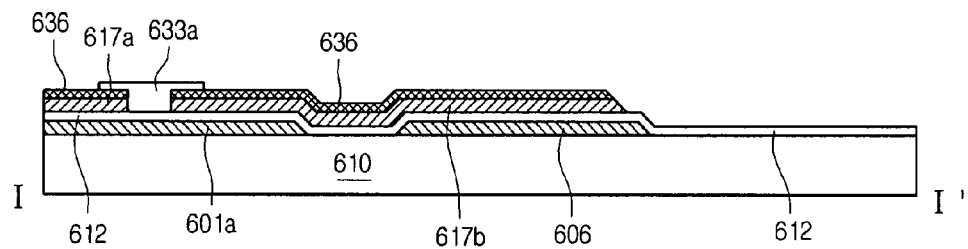

After the liquid-phase silicon layer 633 is formed in the channel region, an annealing process is performed to form a channel layer 633a, as shown in FIG. 8D. As the annealing process is performed, a thickness of the liquid-phase silicon layer is reduced such that a height of the channel layer 106 above the gate insulation layer 612 becomes similar to that defined by the source and drain electrodes 617a and 617b and the ohmic contact layers 636. The annealing process is performed by heating the substrate up to a temperature of 200-800° C. (540° C.) and irradiating a laser having a wavelength of 308 nm and an energy of 345 mJ/cm$^2$. In more detail, solvent contained in the channel pattern is removed through the heating process and thus a thickness of the channel pattern is reduced. Further, the silicon is changed into polysilicon by irradiating the laser. However, embodiments of the present invention are not limited to this configuration. The heating temperature and the energy of the laser may vary in accordance with a degree of crystallization, or a size of the LCD device and a material property of the liquid-phase silicon.

Figure 8E:
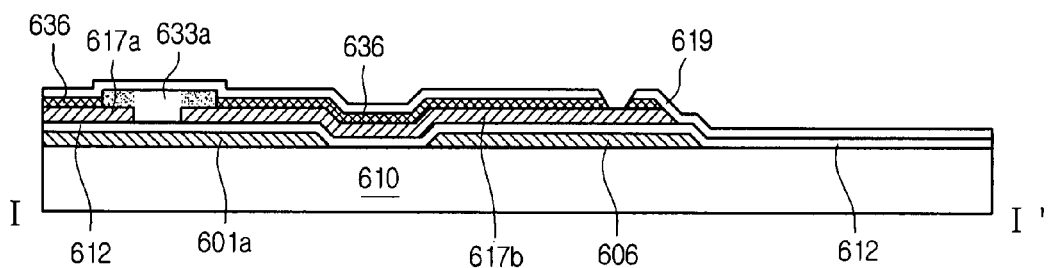
Figure 8F:
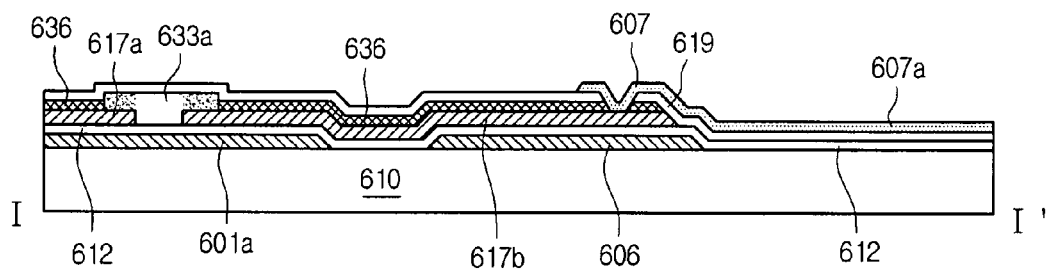

After the channel layer 633a is formed, a passivation layer 619 is formed on the insulation substrate 610 and etched to expose a part of the ohmic contact layer 636 formed on the drain electrode 617b, as shown in FIG. 8e. The passivation layer 619 can be an inorganic or organic layer. A transparent metal layer, such as an ITO layer, is then formed on the passivation layer 619. Then, the second storage electrode 607 and the first pixel electrode 607a are formed through a mask process. More specifically, the second pixel electrode, second common line and second common electrode that are shown in FIG. 7 are patterned together.

Figure 9:
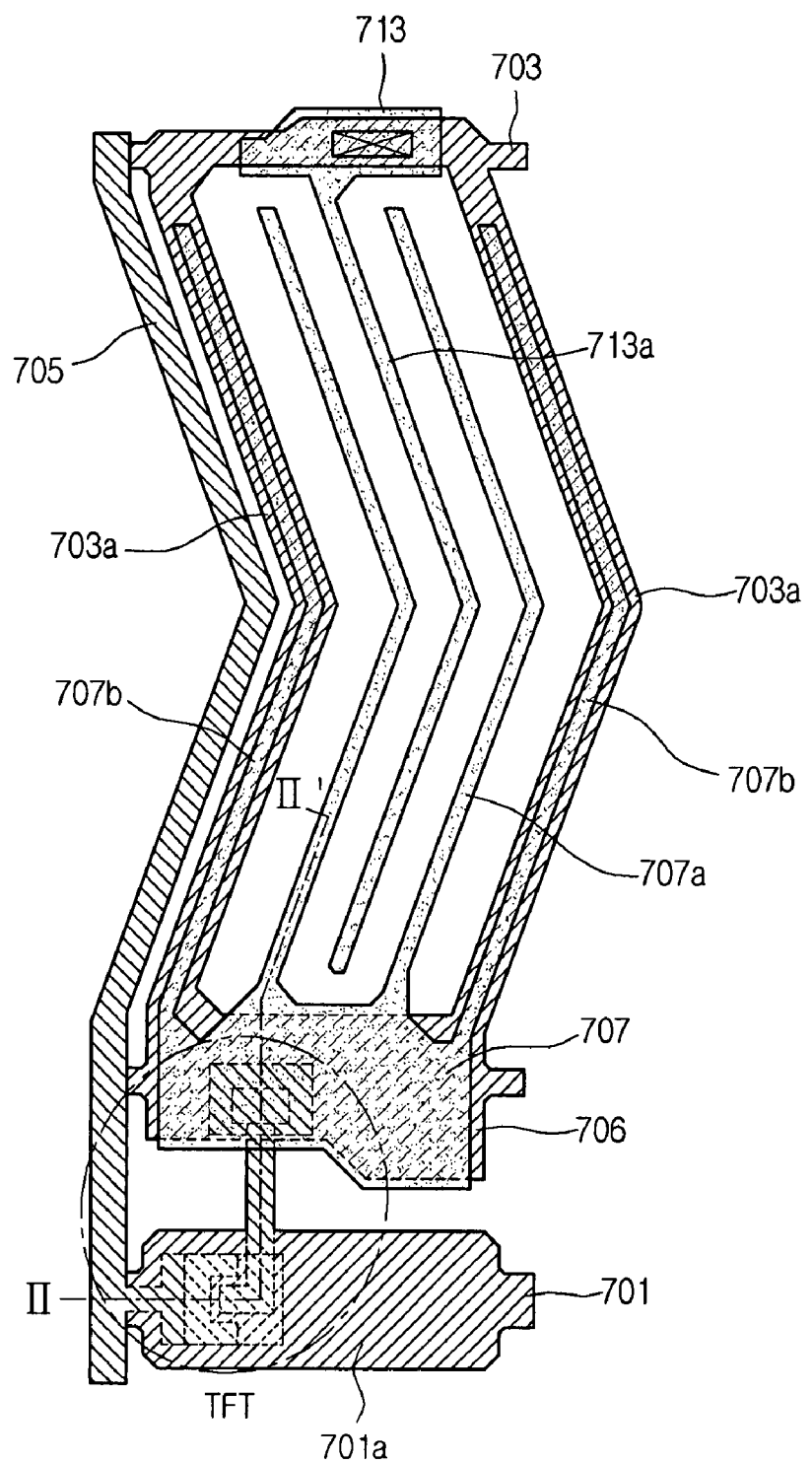
FIG. 9 is a top plan view of a pixel structure of a liquid crystal display device according to the second embodiment of the present invention.

FIG. 9 is a top plan view of a pixel structure of a liquid crystal display device according to a second embodiment of the present invention. As shown in FIG. 9, a gate line 701 for applying a driving signal and a data line 705 for applying a data signal are arranged to cross each other to define a unit pixel area. A TFT is disposed at a region where the gate line 701 crosses the data line 705.

A first common line 703 is formed in the unit pixel area. The first common line 703 is parallel with the gate line 701 and crosses the data line 705. A first common electrode 703a extends from opposite sides of the common line 703 parallel to the data line 705. The data line 705 and the first common electrode 703a are bent at a predetermined angle to provide a wide viewing angle.

A first storage electrode 706 is formed in a region adjacent to the gate line 701 and the gate electrode 701a and connected to the first common electrode 703a. Accordingly, the first storage electrode 706 is integrally formed with the first common line 703, the first common electrode 703a and the first storage electrode 706 to define a closed loop structure. A second common line 713 is formed to overlap a central region of the first common line 703 formed in the unit pixel area and electrically connected to the first common line 703. Further, the second common electrode 713a extends from the second common line 713. The second common electrode 713a is also bent at a predetermined angle to be parallel with the first common electrode 703a and the data line 705, thereby providing a wide viewing angle.

A second storage electrode 707 for forming a storage capacitance is formed above the first storage electrode 706 to overlap the first storage electrode 706. First and second pixel electrodes 707a and 707b extend from the second storage electrode 707 to the unit pixel area. More particularly, the first pixel electrodes 707a extend from the second storage electrode 707 and are alternately arranged with the second common electrodes 713 in a transmission area of the unit pixel area. The first pixel electrodes 707a are also bent at a predetermined angle. The second pixel electrodes 707b arranged at both edges of the pixel area extend from the second storage electrode 707 and are disposed to overlap the first common electrode 703a extending from the first common line 703. A storage capacitance is formed between the first and second storage electrodes 706 and 707 and another storage capacitance is formed between the first common electrode 703a and the second pixel electrode 707b, thereby increasing the overall storage capacitance.

As described above, as the overall storage capacitance increases at the unit pixel area, the display quality can be improved. Further, since the channel layer is formed without performing a PECVD process, the process load can be reduced. Furthermore, since the channel layer and the ohmic contact layer are simultaneously formed after the source and drain electrodes are formed, the fabrication process can be simplified.

Figure 10A:
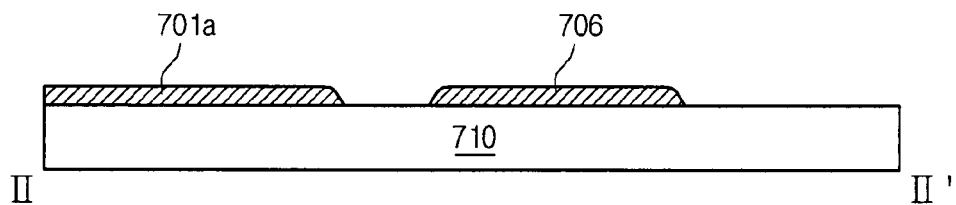
FIGS. 10A through 10G are cross-sectional views taken along line II-II' of FIG. 9, illustrating a method of fabricating the liquid crystal display device of FIG. 9.

FIGS. 10A through 10G are cross-sectional views taken along line II-II' of FIG. 9, illustrating a method of fabricating the liquid crystal display device of FIG. 9. As shown in FIG. 10A, a metal layer is formed on a transparent insulating substrate 710. Then, a gate line, gate electrode 701a, first common line, and first storage electrode 706 are formed through a first mask process.

Figure 10B:
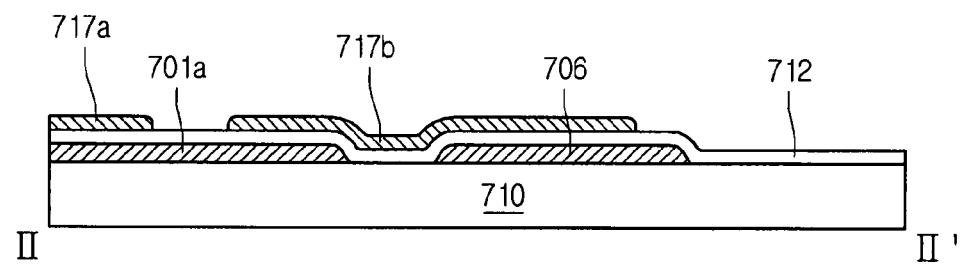

Then, a gate insulation layer 712 is formed over the gate line, gate electrode 701a, first common line, and first storage electrode 706. A metal layer is then formed over the gate insulation layer 712. Subsequently, a photoresist is deposited on the metal layer and used simultaneously pattern the source electrode 717a, drain electrode 717b and the data line (not shown) by etching the metal layer through a photolithography process, as shown in FIG. 10B.

After the source and drain electrodes 717a and 717b are formed, a liquid-phase silicon layer 733 is formed over the doping layer 736 is formed on the liquid-phase silicon layer 733. The liquid-phase silicon layer 733 is formed of silicon containing material, such as $Si_xH_{2x}$ (CyclopentaSilane). The doping layer 736 may be a PSG layer, a BSG layer, or an amorphous silicon layer doped with $N^+$ or $P^+$ ions.

Figure 10C:
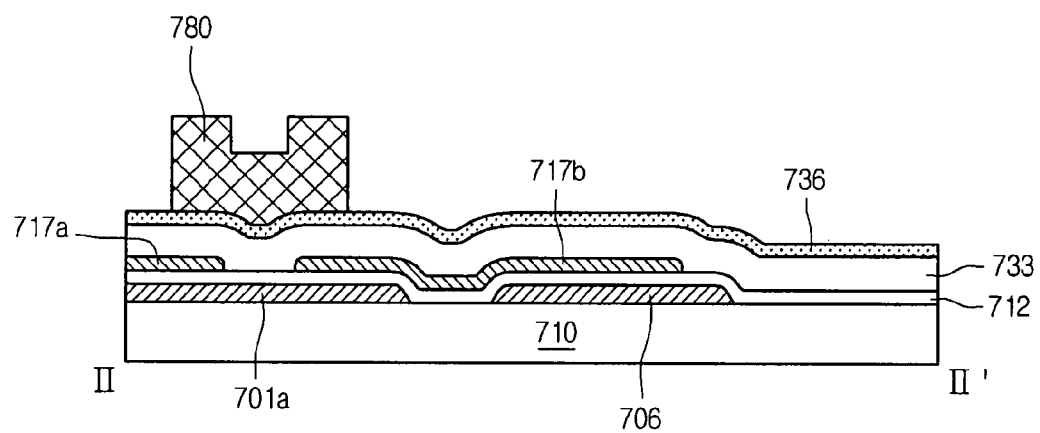
Figure 10D:
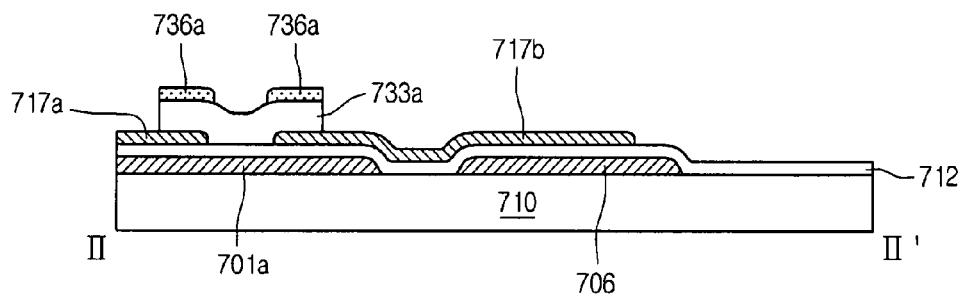

After the liquid-phase silicon layer 733 and the doping layer 736 are formed, photoresist is deposited on the doping layer 736, after which a halftone pattern 780 is formed at a channel region over the gate electrode 701a through a diffraction mask or halftone mask process. After the halftone pattern 780 is formed on the doping layer 736, as shown in FIG. 10C, an etching process is performed to form a channel pattern 733a and an ohmic pattern 736a that is partly overlapping the source and drain electrodes 717a and 717b, as shown in FIG. 10D.

Figure 10E:
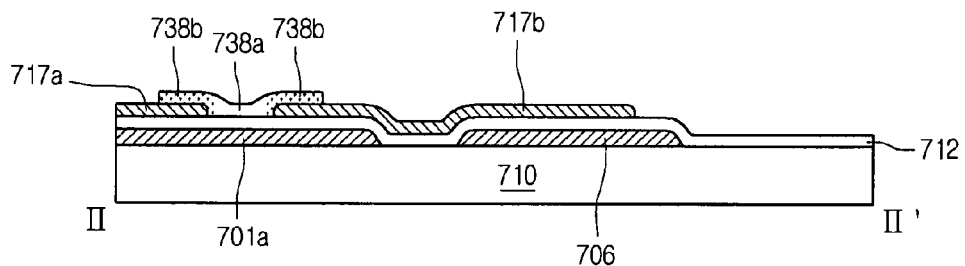

Subsequently, as shown in FIG. 10E, an annealing process and a contact layer forming process using a laser are performed to form a channel layer 738a on a region corresponding to the gate electrode 701a and to form an ohmic contact layer 738b on a region contacting the source and drain electrodes 717a and 717b. The annealing process and the contact layer forming process are performed by heating the substrate up to a temperature of 200-800° C. (about 540° C.) and irradiating a laser having a wavelength of 308 nm and an energy of 345 mJ/cm2. In more detail, solvent contained in the channel pattern is removed through the heating process and thus a thickness of the channel pattern is reduced. Further, the silicon is changed into polysilicon by irradiating the laser. In addition, during the above process, the doping layer is vertically diffused to the channel pattern to form the ohmic contact layer 738b.

Figure 10F:
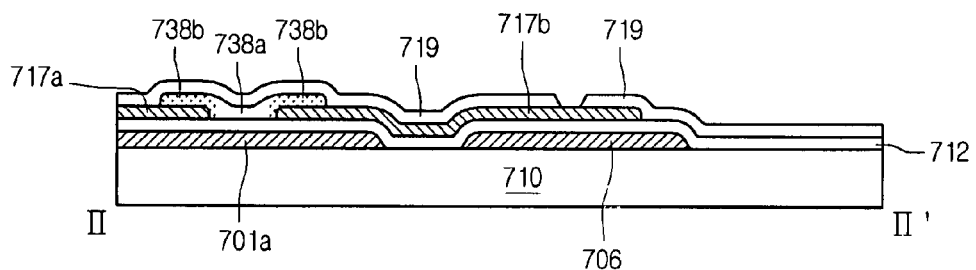

Next, as shown in FIG. 10F, a passivation layer 719 is additionally formed on the insulation substrate 710, after which a contact hole forming process for partly expose the drain electrode 717b.

Figure 10G:
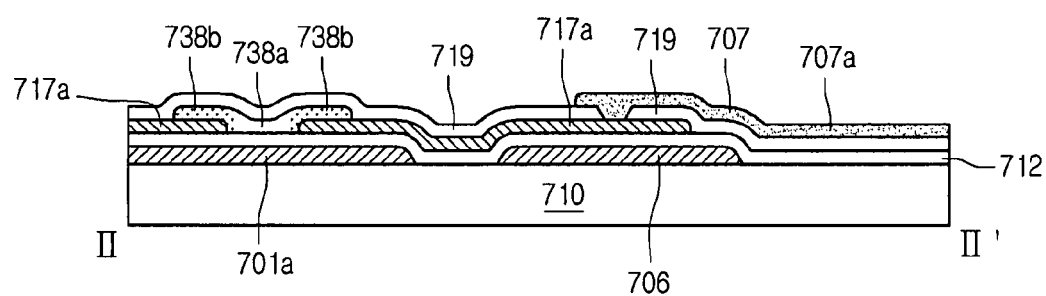

After the contact hole forming process is finished, as shown in FIG. 10G, a transparent metal layer, such as an ITO layer, is formed. The second storage electrode 707 and the first pixel electrode 707a are formed through a mask process. At this point, the second pixel electrode, second common line and second common electrode that are shown in FIG. 9 are patterned together.

The method for fabricating the LCD device is not limited to the above-described embodiments. That is, the TFT fabrication methods illustrated in FIGS. 4A through 4C, FIGS. 5A through 5C, and FIGS. 6A through 6C may be applied to the method for fabricating the LCD device. In addition, the above described TFT fabrication methods and LCD fabrication methods may be applied to a method of fabricating other flat display devices as well as the LCD device.

According to embodiments of the present invention, an effect where the channel layer and ohmic contact layer of the TFT are simultaneously formed can be obtained. In addition, the channel layer can be formed without performing deposition and mask processes so as to reduce process load reduced. Further, since the source and drain electrodes and the ohmic contact layer are simultaneously patterned, the fabrication process can be simplified. Because the channel layer and the ohmic contact layer of the TFT are simultaneously formed using the liquid-phase silicon and the halftone mask (refraction mask), the fabrication process can be simplified to reduce costs.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a thin film transistor comprising:
   forming a gate electrode on a substrate;
   forming a gate insulation layer on the gate electrode;
   forming source and drain electrodes on the gate insulation layer;

forming doping layers over the source and drain electrodes; and providing a liquid-phase silicon layer over and in between the source and drain electrodes on the doping layers through a coating process; and annealing the liquid-phase silicon layer to form a polysilicon channel layer and ohmic contact regions for contacting the polysilicon channel layer to the source and drain electrodes, wherein the doping layers are is one of phosphor-silicate-glass and boro-silicate glass.

2. The method of forming a thin film transistor according to claim 1, wherein the coating process is an inkjet method.

3. The method of forming a thin film transistor according to claim 1, wherein the annealing process includes using a laser.

4. The method of forming a thin film transistor according to claim 3, wherein the annealing process includes heating the substrate up to a temperature of 200-800° C.

5. The method of forming a thin film transistor according to claim 1, wherein the liquid-phase silicon layer includes CyclopentaSilane.

6. The method according to claim 1, wherein the ohmic contact regions are formed by diffusing the doping layers into the liquid-phase silicon layer.

* * * * *